(12) United States Patent
Stenberg et al.

(10) Patent No.: US 11,275,123 B2
(45) Date of Patent: Mar. 15, 2022

(54) SYSTEM AND METHOD FOR ELECTRIC METER OUTAGE TIME DETECTION

(71) Applicant: Landis+Gyr LLC, Lafayette, IN (US)

(72) Inventors: David Stenberg, West Lafayette, IN (US); Robert Monroe, Brentwood, CA (US)

(73) Assignee: Landis+Gyr LLC, LaFayette, IN (US)

(*) Notice: Subject to any disclaimer, the term of this patent is extended or adjusted under 35 U.S.C. 154(b) by 662 days.

(21) Appl. No.: 16/104,805

(22) Filed: Aug. 17, 2018

(65) Prior Publication Data

US 2019/0383866 A1 Dec. 19, 2019

Related U.S. Application Data

(60) Provisional application No. 62/685,563, filed on Jun. 15, 2018.

(51) Int. Cl.
*G01R 31/42* (2006.01)
*G01R 22/06* (2006.01)
(Continued)

(52) U.S. Cl.
CPC .......... *G01R 31/42* (2013.01); *G01R 22/063* (2013.01); *G01R 22/068* (2013.01); *G01R 19/175* (2013.01); *G01R 31/54* (2020.01)

(58) Field of Classification Search
CPC ...... G01R 22/068; G01R 19/175; H02H 3/46; Y04S 20/30
See application file for complete search history.

(56) References Cited

U.S. PATENT DOCUMENTS

| 4,467,434 A | 8/1984 | Hurley et al. |
| 5,918,380 A * | 7/1999 | Schleich ............. G01R 21/133 340/870.02 |

(Continued)

FOREIGN PATENT DOCUMENTS

| JP | H07-333266 A | 12/1995 |
| JP | 2008-070285 A | 3/2008 |

(Continued)

OTHER PUBLICATIONS

PCT Patent Application No. PCT/US2019/037165, International Search Report and Written Opinion, dated Oct. 7, 2019, 16 pages.

(Continued)

*Primary Examiner* — Michael J Dalbo
(74) *Attorney, Agent, or Firm* — Kilpatrick Townsend & Stockton LLP (57) ABSTRACT

A method identifies a duration of power interruptions in an electrical monitoring system. The method includes receiving, with an external monitoring system, a load profile from an electric meter that includes at least one of an accumulated frequency measurement and an accumulated number of zero crossing events that the electric meter records in an AC power signal during a predetermined monitoring period, and identifying a total duration of at least one power interruption during the predetermined monitoring period based on at least one of a deviation of the accumulated frequency measurement in the load profile from a predetermined accumulated frequency value or a deviation of the accumulated number of zero crossing events in the load profile from a predetermined number of zero crossing events during the predetermined monitoring period.

16 Claims, 4 Drawing Sheets

(51) Int. Cl.
    *G01R 31/54*    (2020.01)
    *G01R 19/175*   (2006.01)

(56) References Cited

U.S. PATENT DOCUMENTS

| | | | |
|---|---|---|---|
| 5,924,051 A | 7/1999 | Provost et al. | |
| 2008/0279321 A1* | 11/2008 | Bickel | H04B 3/542 |
| | | | 375/356 |
| 2012/0007570 A1* | 1/2012 | Valenti | H02M 5/2573 |
| | | | 323/235 |
| 2012/0013347 A1* | 1/2012 | Holsomback | G01R 31/016 |
| | | | 324/548 |
| 2015/0309103 A1 | 10/2015 | Ostrovsky et al. | |
| 2016/0057303 A1 | 2/2016 | Fujita | |
| 2016/0103163 A1 | 4/2016 | Schamber et al. | |
| 2016/0315465 A1 | 10/2016 | Ferguson | |
| 2018/0246556 A1* | 8/2018 | Pasqua | H02M 3/156 |

FOREIGN PATENT DOCUMENTS

| | | |
|---|---|---|
| JP | 2009-041918 A | 2/2009 |
| JP | 2014-176206 A | 9/2014 |

OTHER PUBLICATIONS

SAIDI (System Average Interruption Duration Index)—Wikipedia web page, https://en.wikipedia.org/wiki/SAIDI.

* cited by examiner

SYSTEM AND METHOD FOR ELECTRIC METER OUTAGE TIME DETECTION

CLAIM OF PRIORITY

This application claims the benefit of U.S. Provisional Application No. 62/685,563, which is entitled "System and Method For Electric Meter Outage Time Detection," and was filed on Jun. 15, 2018, the entire contents of which are expressly incorporated herein by reference.

TECHNICAL FIELD

This disclosure relates to electric meters generally and, more particularly, to electric meters that can measure the length of time of electrical power interruptions in power lines that the electric meter monitors.

BACKGROUND

Electricity meters are devices that measure and/or meter aspects of energy provided to a load. The load may be a residence, business, or even part of a larger electricity distribution system. Commonly available meters include electromechanical meters and electronic meters. Electromechanical meters employ a rotating disk that rotates in response to electric and magnetic fields induced by the electricity passing to the load. As is known in the art, the disk rotation speed is a function of the amount of electricity delivered to the load. Mechanical counters accumulate the number of disk rotations, which is indicative of energy consumed by the load. In some cases, an electromechanical meter can employ processing circuitry to perform additional operations with the consumption information provided by the rotating disk.

Electronic meters typically employ processing circuitry instead of the rotating disk and mechanical counters. In such meters, sensors within the meter detect the voltage and current that is delivered to the load. Circuitry within the meter converts the sensed voltage and current into digital values. Processing circuitry then employs digital signal processing to calculate consumed energy, among other things, from the digital values. Electronic meters provide greater flexibility in the types of energy consumption information that they may calculate, track, and store.

During operation, the electric lines that an electric meter monitors may experience interruptions in providing power due to power outages that occur in a power grid. In many instances, electrical utilities are required to provide aggregate information about an average amount of time that different portions of a power grid experience an interruption to electrical power. This measurement can refer to an average amount of time that the power grid experiences a power loss during a predetermined time span, such as a monthly or annual time span, where of course in many instances only a portion of the power grid experiences an interruption at any one time. One example of such a measurement is the System Average Interruption Duration Index (SAIDI), which is expressed mathematically as:

$$SAIDI = \frac{\sum U_i N_i}{N_T}$$

where $N_i$ refers to a total number of customers at a particular location i, $U_i$ is the total duration of power interruptions at the location i, and $N_T$ is the total number of customer locations. The SAIDI measurement is generally calculated over a one year period to provide an average duration of power interruptions for a power grid that provides power to multiple locations and customers.

In some existing electrical systems, interruptions to electrical power delivery are monitored from a centralized system, but while such monitoring can identify large-scale power outages effectively, the monitoring process may not identify smaller-scale power outages that have shorter durations accurately. Consequently, improvements to systems that monitor the consumption of electrical power to increase the accuracy of measuring periods of power interruption would be beneficial.

SUMMARY

In one embodiment, a method of identifying power interruptions has been developed. The method includes receiving, with an external monitoring system, a load profile from an electric meter that includes at least one of an accumulated frequency measurement and an accumulated number of zero crossing events that the electric meter records in an AC power signal during a predetermined monitoring period, and identifying, with a processor in the external monitoring system, a total duration of at least one power interruption during the predetermined monitoring period based on at least one of a deviation of the accumulated frequency measurement in the load profile from a predetermined accumulated frequency value or a deviation of the accumulated number of zero crossing events in the load profile from a predetermined number of zero crossing events during the predetermined monitoring period.

In another embodiment, a method of operating an electric meter to identify power interruptions has been developed. The method includes operating, with a battery in the electric meter, at least one component in the electric meter in response to a first power interruption in a power line connected to the electric meter, identifying, with a control device in the electric meter, a duration of the first power interruption based on a duration of a time on battery while operating with the battery in the electric meter after the first power interruption, and transmitting, with an output device in the electric meter, a message including a total duration of power interruptions including the duration of the first power interruption to an external monitoring system.

In another embodiment, a system for monitoring power interruptions has been developed. The system includes an electric meter. The electric meter includes a voltage sensor, an output device, and a control device operatively connected to the voltage sensor and the output device. The control device is configured to monitor an AC power signal in a power line that is connected to the electric meter using the voltage sensor, identify at least one of an accumulated frequency measurement of the AC power signal during a predetermined monitoring period or an accumulated number of zero crossing events in the AC power signal during the predetermined monitoring period, and transmit a load profile that includes at least one of the accumulated frequency measurement and the accumulated number of zero crossing events with the output device to an external monitoring system to enable the external monitoring system to identify a total duration of at least one power interruption in the AC power signal that occurs during the predetermined monitoring period.

BRIEF DESCRIPTION OF THE DRAWINGS

The foregoing aspects and other features of system and methods for the measurement of the duration of electrical power interruptions are explained in the following description, taken in connection with the accompanying drawings.

DETAILED DESCRIPTION

For a general understanding of the environment for the device disclosed herein as well as the details for the device, reference is made to the drawings. In the drawings, like reference numerals designate like elements.

As used herein, the term "metrology circuit" refers to any suitable circuit that detects, measures, and determines one or more electricity and/or electrical energy consumption values based on energy flowing between terminals of an electric meter that are connected in-line with a power line between an electric power source and the load that receives the electric power. In one common configuration, a power grid or other generation source is connected to one set of terminals and the load that receives the electrical power is connected to the other set of terminals. The electric power in the power line flows through the electric meter and the metrology circuit measures various aspects of the electrical signal including, but not necessarily limited to, voltage and current.

As used herein, the terms "power outage" and "power interruption" are used interchangeably and refer to an event in which the normal supply of electric power through one or more power lines that are connected to an electric meter temporarily ceases. Power outage and interruption events are also referred to as "blackouts" in which all electrical power ceases to flow through the power lines or the level of electrical power drops to a level that prevents normal operation of a load and the electric meter.

Figure 1:
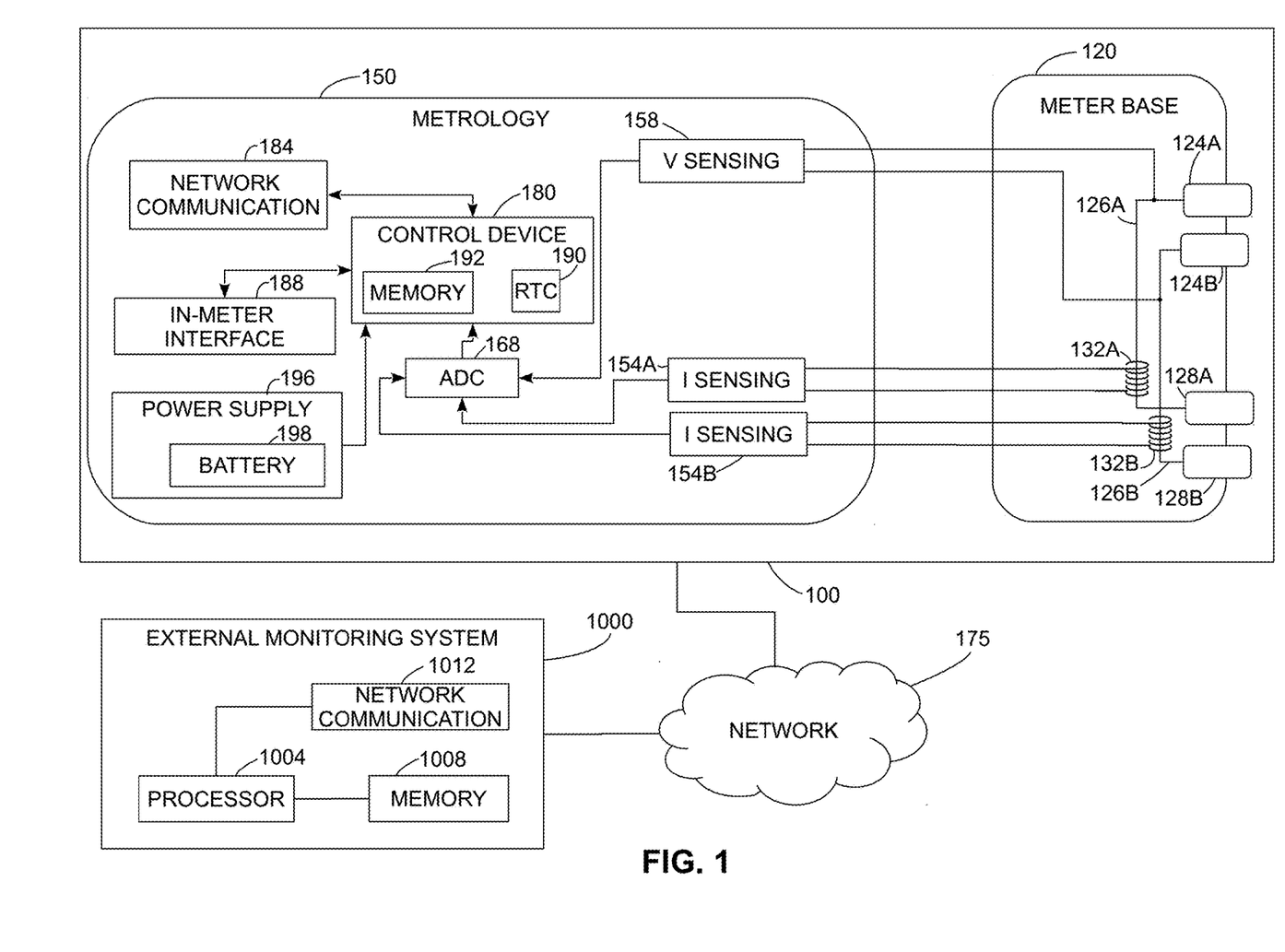
FIG. 1 is a schematic diagram of an electric meter that is configured to measure power interruptions.

FIG. 1 depicts an electric meter 100 that is configured to measure the duration of power interruptions in the supply of electricity through one or more power lines that are connected to the electric meter 100 and to transmit load profile data to an external monitoring system 1000 via a network 175. The electric meter 100 includes a meter base 120 and a metrology circuit 150 that are supported by and at least partially contained within a housing of the electric meter.

The meter base 120 includes two pairs of terminals 124A/128A and 124B/128B that are electrically connected together by conductors 126A and 126B, respectively. In the meter base 120, each of the terminals 124A, 124B, 128A, and 128B is formed from an electrically conductive member, often referred to as a "blade" or a "stab", which extends from the housing of the electric meter to engage a socket that is connected to a power line (socket and power line not shown). Each of the terminal pairs 124A/128A and 124B/128B is configured to connect in-line with a conductor in a powerline where all of the power that passes through the power line from an energy source to a load passes through the terminal pairs 124A/128A and 124B/128B to a load. The terminal pairs 124A/128A and 124B/128B and the electrical conductors 126A and 126B effectively become part of the power line connected between the generation source and the load when the electric meter 100 is connected to the socket. While FIG. 1 depicts two pairs of terminals with two conductors that are configured to be connected in-line with a power line that includes two conductors (and that often includes a neutral conductor not shown in the drawings), alternative embodiments optionally include only one pair of terminals for a single conductor or additional pairs of terminals with additional conductors to enable monitoring of power lines that include more than two conducting lines, such as three-phase power lines.

The meter base 120 includes inductive coils 132A and 132B that are inductively coupled to the electrical conductors 126A and 126B, respectively. As described in further detail below, the inductive coils 132A and 132B are electrically connected to electrical current sensors 154A and 154B in the metrology circuit 150. The alternating current (AC) power signals in the electrical conductors 126A and 126B induce a current in the inductive coils 132A and 132B, respectively, that the metrology circuit 150 uses to monitor electrical current levels in the power line. The inductive coils 132A and 132B are also referred to as "coil transformers" since in some embodiments the inductive coils 132A and 132B form one set of coils in a current transformer in which a second set of coils produce a current measurement signal. While FIG. 1 depicts the coils 132A/132B and current sensors 154A/154B for illustrative purposes, other embodiments may employ different current sensing devices that are otherwise known to the art.

Referring to the metrology circuit 150 include current sensors 154A/154B, and voltage sensors 158. The metrology circuit 150 further includes an analog-to-digital converter 168, a digital control device 180, network communication device 184, and in-meter control interface 188. The metrology circuit 150 receives electrical power for operation from the power line via the terminal pairs 124A/128A and 124B/128B that are connected to a power supply 196 (connections omitted for clarity). The power supply 196 is, for example, a switched capacitor power supply or other suitable conversion circuit that produces direct current (DC) electrical output power from the AC power received at the terminals to provide electrical the components in the electric meter 100. The power supply 196 provides electrical power to the components in the metrology circuit 150 and the meter base 120 that require electrical power during operation of the electric meter 100. The power supply 196 further includes a battery 198 that provides electrical power to operate the control device 180 during a power interruption to the normal AC voltage and current flow through the power lines that are connected to the electric meter 100. In other embodiments a capacitor or other energy storage device in the electric meter 100 supplies electrical power to the control device 180 and optionally other components in the electric meter 100 during a power interruption.

In the metrology circuit 150, the current sensors 154A/154B are each connected to one of the inductive coils 132A and 132B, respectively, to enable the current sensors to monitor the levels of electrical current in the electrical conductors 126A and 126B, respectively. In one embodiment, the current sensors 154A and 154B each includes a second set of coils that are coupled to the corresponding inductive coils 132A or 132B in a coil transformer arrangement. The coils in the current sensors 154A and 154B generate electrical currents that correspond to the current levels in the electrical conductors 126A and 126B, although at greatly reduced amplitudes to enable measurement of the current in an efficient manner and with the current sensors having galvanic isolation from the much higher current levels of the electrical conductors 126A and 126B. The current sensors 154A and 154B generate analog current measurement signals that are supplied to the ADC 168 to be provided as digital current level signals to the control device 180, although in an analog electrical meter an analog control circuit may receive the analog current measurement signals directly.

In the metrology circuit 150, the voltage sensor 158 is connected to both of the electrical conductors 126A and 126B. The voltage sensor 158 is configured to generate an analog voltage measurement signal having a waveform representative of the voltage provided to the load through the power line. The outputs of the voltage sensor 158 is connected to the ADC 168 to enable the control device 180 to receive digitized representations of the measured voltage levels from the voltage sensors 158. In one embodiment, the voltage sensor 158 includes a voltage divider circuit to bring the measured voltage waveform to a magnitude that is suitable for the ADC 168. The voltage sensor 158 may alternatively take other known forms.

In the electric meter 100, the control device 180 is a digital logic device that includes, for example, one or more microprocessors, microcontrollers, field programmable gate arrays (FPGAs), digital signal processors (DSPs), programmable logic controllers (PLCs), application specific integrated circuits (ASICs), and the like. In the embodiment of FIG. 1, the control device 180 also includes or is operatively connected to a real time clock (RTC) 190 and a memory 192. The RTC 190 tracks the time at which the meter 100 records samples of input sensor data from the current sensors 154A/154B and voltage sensor 158. As described below, the control device 180 also uses the RTC 190 to measure the duration of "time on battery" events that correspond to the duration of power interruptions in some embodiments. The memory 192 includes one or more memory devices that store programmed software or firmware instructions that the control device 180 executes to operate the electric meter 100 in conjunction with the other components of the electric meter. The memory 192 also stores "load profile" records that the electric meter generates during a predetermined monitoring period, which is typically on the order of one minute to one hour in duration although other embodiments may use longer or shorter monitoring periods. The load profile typically includes multiple data fields in the load profile that are referred to as "channels" that include, for example, measurements of the accumulated energy consumption of loads that are attached to the power line, an accumulation of frequency measurements in the voltage of the AC power signal, an accumulation of zero crossing events in the voltage of the AC power signal, and other information that the electric meter 100 records and reports to a centralized monitoring system. In some embodiments, if the electric meter 100 experiences a power interruption during a monitoring period then the electric meter 100 sets a value in the load profile indicating that monitoring only occurred for a partial monitoring period instead of for the full predetermined monitoring period. The memory 192 is implemented using at least one non-volatile memory device such as a NAND or NOR memory device or other suitable solid-state memory, and in some embodiment the memory 192 includes a volatile memory device such as random access memory (RAM). In addition to the specific functions described herein, the control circuit 180 also performs metrology routines, display routines, communication routines, that are commonly associated with the operation of electric meters. As depicted in FIG. 1, the control device 180 receives input data from the current sensors 154A and 154B and the voltage sensor 158, either directly or indirectly via the ADC 168.

In the metrology circuit 150, the control device 180 is operatively connected to network communication device 184 and the in-meter interface 188 in addition to being connected to receive input data from the current sensors 154A/154B and the voltage sensors 158. The network communication device 184 and the in-meter interface are both examples of output devices. The network communication device 184 is, for example, an analog modem or digital subscriber line (DSL) device that couples to a telephone network, an Ethernet transceiver that transmits data over a wired network, a local serial bus output such as RS-232 or Universal Serial Bus (USB), or either or both of a wireless local area network (WLAN) or wide area network (WWAN) transceiver that transmits metrology data to the external monitoring system 1000. In the metrology circuit 150, the in-meter interface 188 provides a visual and in some instances audible output device that enables manual meter reading and manual inspection of the electric meter to retrieve power consumption and power interruption data. Examples of in-meter interfaces include mechanical gauges, indicator lights, LCD or LED display screens, alarm bells or speakers and the like. The in-meter interface optionally includes control inputs that enable an operator to send commands to the control device 180 while physically present at the electric meter. While the metrology circuit 150 includes both the network communication device 184 and the in-meter interface 188, some embodiments of electric meters that measure the durations of power interruptions only include a network communication device 184 or an in-meter interface 188, but not both elements. For example, some electric meters have no need to communicate with a remote system via a data network and only include the in-meter interface 188, while other electric meters rely exclusively on the network communication device 184 to transmit the meter data and do not include the in-meter interface 188.

In FIG. 1, the external monitoring system 1000 includes a processor 1004 that is operatively connected to a memory 1008 and a network communication device 1012. In the external monitoring system 1000, the processor 1004 is a central processing unit (CPU) or other suitable digital logic device that is configured to process load profile information that the external monitoring system 1000 receives using the network communication device 1012 to communicate with the corresponding network communication device 184 in the electric meter 100 via the network 175. The memory 1008 stores programmed instructions for the processor 1004, load profile data that are received from the electric meter 100, and stores records of the accumulate duration of power interruptions that may occur in the electric meter 100 over a series of predetermined monitoring periods. While not depicted in further detail in FIG. 1, in some configurations the external monitoring system 1000 receives and processes load profile data from a plurality of electric meters with the same or similar configuration as the electric meter 100.

In various configurations the external monitoring system 1000 includes, for example, a head end unit that monitors the electric meter 100 and in some embodiments other electric meters that are not expressly shown in FIG. 1. Electric utilities, site owners, or other entities operate the external monitoring system 1000 to monitor power interruptions in the electric meter 100 to calculate SAIDI and monitor power interruptions. In particular, the external monitoring system 1000 periodically receives a load profile from the electric meter 100 that includes channels for either or both of the accumulated frequency measurement and accumulated zero crossing measurement. The external monitoring system 1000 determines the duration of one or more power interruptions that may occur during a predetermined monitoring period based on the accumulated frequency measurement and accumulated zero crossing channels. Additionally, in some configurations the external monitoring system 1000 transmits command messages to the control device 180 in the electric meter 100 via the network communication device 184.

During operation, the electric meter 100 transmits load profile data including the channels that identify either or both of the accumulated frequency counts and accumulated zero crossing counts to the external monitoring system 1000 via the network 175. As described in more detail below, the external monitoring system 1000 identifies the duration of power interruptions that the electric meter 100 experiences during one or more predetermined monitoring periods to enable fine-grained tracking of the duration of power interruptions to measure SAIDI and to perform other monitoring operations in an electric power distribution system. The control device 180 in the electric meter optionally measures the durations of power interruptions and stores records of the total duration of any power interruptions that occur during a predetermined monitoring period (e.g. a 15 minute period). The control device 180 also generates transmits reports of the total duration of power interruptions that occur over one or more monitoring periods, such as a total duration of power interruptions over the course of an hour, day, week, month, or year, to a monitoring service using the network communication device 184. The operation of the electric meter 100 to track the duration of power interruptions is described in further detail below.

Figure 2:
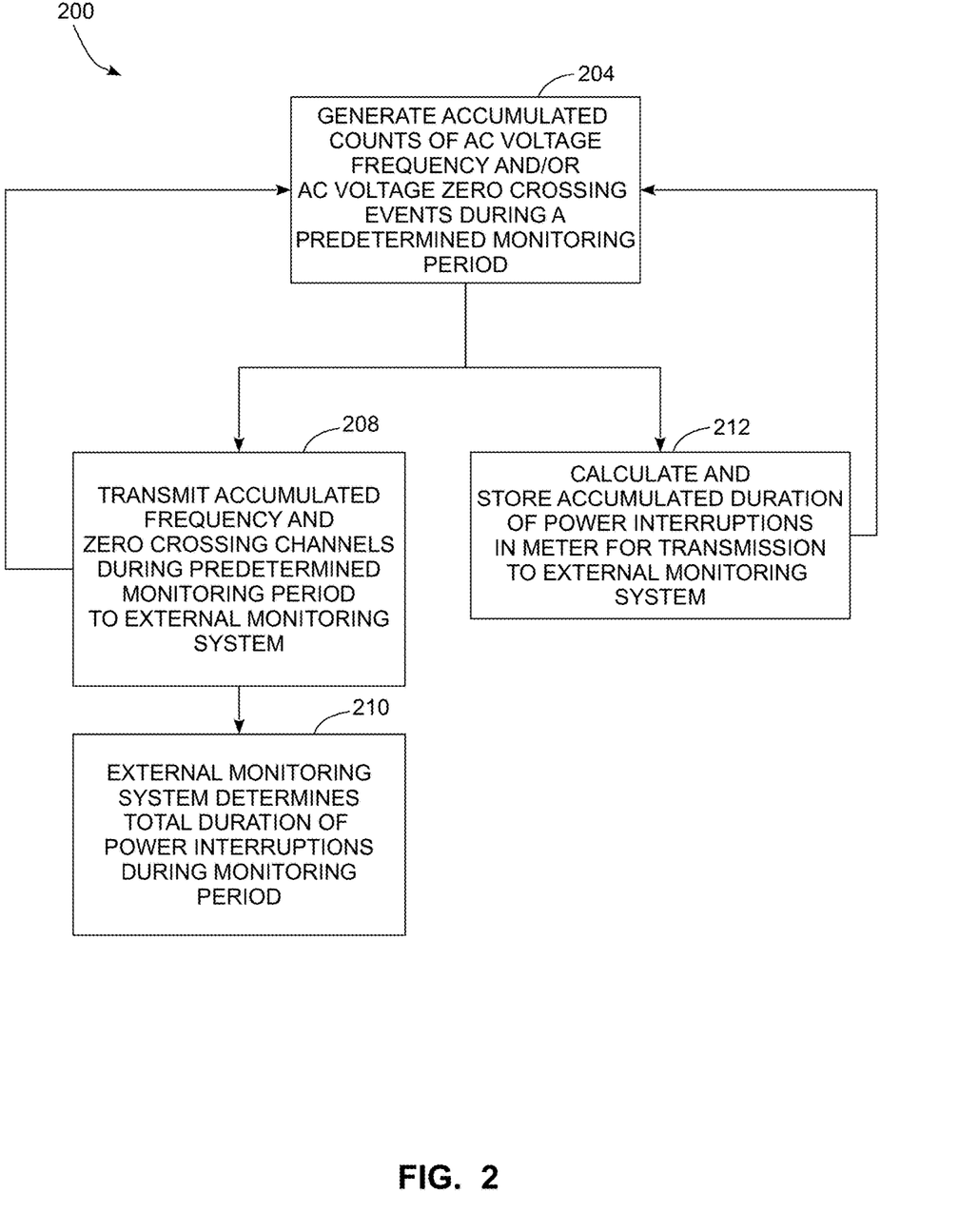
FIG. 2 is a block diagram of a process that the electric meter 100 performs to measure the duration of power interruptions.

FIG. 2 depicts a process 200 for operation of an electric meter to measure, record, and report the durations of power interruptions. In the description below, a reference to the process 200 performing a function or action refers to the operation of a digital processing device, such as a control device in a meter, a processor in an external monitoring system, or a combination thereof, to execute stored program instructions to perform the function or action in association with other components in an electric meter. The process 200 is described in more detail below in conjunction with the electric meter 100 of FIG. 1 and the graph of FIG. 4.

During the process 200, the control device 180 monitors the voltage of the AC power signal that is supplied from a power line using the voltage sensors 158 to record measurements of the accumulated value of frequency measurements, the accumulated value of a total number of zero crossing events, or both, during the predetermined monitoring period (block 204). In the electric meter 100, the voltage of the AC power signal is supplied from a power line and passes between the terminal pairs 124A/128A and 124B/128B in the electric meter 100 during the predetermined monitoring period. In one embodiment, the ADC 168 generates digital samples of the voltage values from the voltage sensors 158 at a sampling frequency that exceeds the expected frequency (e.g. 50 Hz or 60 Hz) of the AC sinusoidal signal to enable the control device 180 to identify features such as positive and negative peaks and zero crossing events in the voltage waveform of each cycle of the AC sinusoidal signal. In one specific example, the ADC 168 generates digital voltage samples at rate in a range of, for example, 1 KHz to 20 KHz to collect multiple samples in each cycle of the sinusoidal AC power signal. As described above, the predetermined monitoring period is any suitable length of time, such as a 15 minute period used in the illustrative embodiment of FIG. 2, which enables the electric meter 100 to produce an average value of the measured AC signal frequency or total number of zero crossings in the AC power signal.

In one configuration, the control device 180 identifies the time difference T between successive positive peaks or negative peaks in the voltage waveform of the AC power signal to measure the frequency of the AC power signal. Each peak occurs when a series of samples of data from the ADC for the voltage of the AC power signal reach a maximum absolute value (positive or negative) and begin to return to zero, and the control device 180 optionally interpolates between data samples to identify the time of each peak with greater accuracy. The control device 180 identifies the frequency of each cycle as $T^{-1}$ and the measured frequency of the signal is an averaged value for multiple cycles that are measured over the predetermined monitoring period. The electric meter 100 generates records of the accumulated frequency measurements of the AC power signal as part of a load profile during a predetermined monitoring period and reports the frequency measurement information to an external monitoring system at regular intervals as one channel in the load profile that also includes additional data collected by the electric meter 100.

Figure 4:
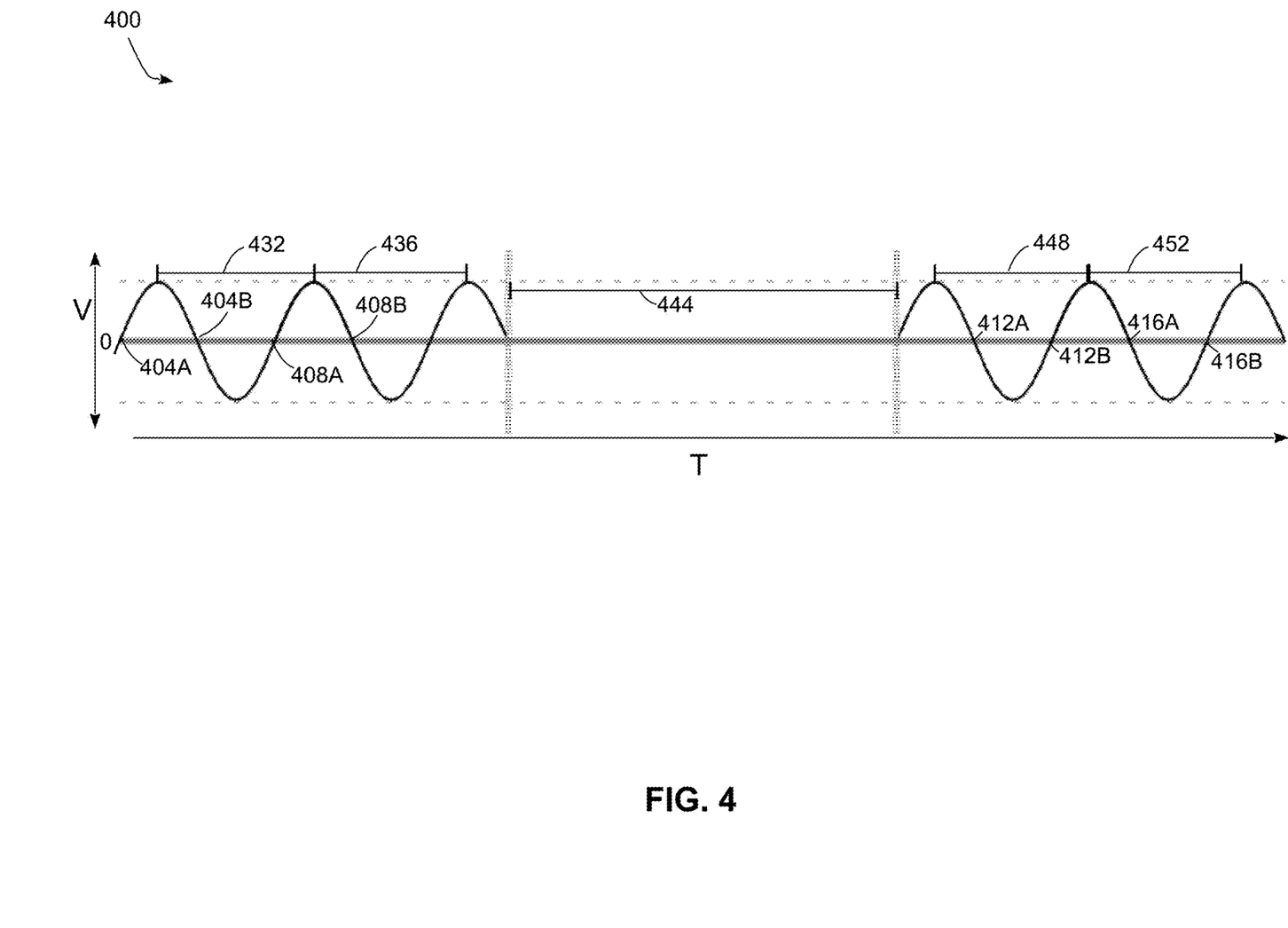
FIG. 4 is a diagram depicting a voltage waveform of an alternating current (AC) power signal that the electric meter of FIG. 1 monitors during a power interruption.

FIG. 4 depicts a graph 400 of the electrical voltage levels of an example AC power signal over time with time periods 432, 436, and 452 that correspond to the expected frequency of the sinusoidal AC power signal at a predetermined frequency, such as 50 Hz or 60 Hz. In another configuration, the meter 100 measures the same periods based on the time between troughs (negative peaks) in each cycle of the AC power signal. The frequency of an AC power signal in a large power grid is generally stable and experiences far smaller variations during normal operation than the voltage levels of the AC signal. During operation, the control device 180 measures the frequency of the AC power signal at a predetermined rate (e.g. four measurements per second in one embodiment) and stores an accumulation of all the frequency measurements in the frequency channel of the load profile that is stored in the memory 192 during each predetermined monitoring period. FIG. 4 also depicts a power interruption 444 in the AC power signal in which there are no additional peaks. The control device 180 does not record any frequency measurements during the power interruption 444 and in most embodiments is not activated during the power interruption 444. The electric meter 100 restarts after the power interruption and the controller 180 continues to record additional frequency measurements, although the total accumulated value of all the frequency measurements during the predetermined monitoring period is lower than expected due to the power interruption. While FIG. 4 depicts a single interruption 444, in some situations the electric meter 100 experiences multiple power interruptions during a single monitoring period, and the embodiments described herein can identify the accumulated duration of one or more power interruptions.

In another configuration, the control device 180 records a count of the accumulated number of zero crossing events that occur in the AC power signal. As depicted in FIG. 4, the zero crossing events occur when the voltage in the AC power signal transitions from a positive to negative or negative to positive voltage, and the control device 180 optionally interpolates between data samples to identify the time of each zero crossing with greater accuracy. In this configuration, the electric meter 100 generates records of the measured zero crossing events of the AC power signal as part of a load profile during a predetermined monitoring period and reports the accumulated zero crossing event measurement information to the external monitoring system at regular intervals as one channel the load profile that also includes additional data collected by the electric meter 100.

FIG. 4 depicts the zero crossings 404A/404B, 408A/408B, 412A/412B, and 416A/416B that occur during different cycles of the AC power signal, where each cycle of the AC power signal includes two zero crossings. The control device 180 identifies each zero crossing event based on a transition of the measured voltage values from a positive value to a negative value or from a negative value to a positive value in the digital sensor data samples that the control device 180 receives from the ADC 168. The control device 180 records an accumulated value of the total number of measured zero crossing events that occur during each predetermined monitoring period. As depicted in FIG. 4, during the power interruption period 444 the AC signal does not produce any zero crossings and the control device 180, which is typically deactivated during the power interruption 444, does not record zero crossing events during the power interruption. During the predetermined monitoring period, the control device 180 records a reduced number of zero crossings compared to a predetermined expected value based on the predetermined frequency of the AC power signal when power interruptions occur.

Referring again to FIG. 2, the process 200 continues as the electric meter 100 transmits the recorded load profile that includes either or both of the accumulated frequency and zero crossing count channels to an external monitoring system that identifies the duration of power interruptions, if any, during one or more of the predetermined monitoring periods (block 208). The electric meter 100 continues monitoring during a subsequent monitoring period as described above with reference to the processing of block 204. In some embodiments of the process 200, the external monitoring system 1000 identifies the duration of any power interruptions that the meter 100 experiences based on one or both of the accumulated frequency channel and the accumulated zero crossing count channel in the load profile (block 210).

In one configuration, the external monitoring system 1000 identifies the duration of a power interruption that occurs during at least one of the predetermined monitoring periods based on the accumulated frequency channel in the load profile data that are received from the electric meter 100. For example, if the nominal frequency of an AC power signal is 60 Hz and the electric meter 100 is configured to record a measurement of the frequency four times per second over a predetermined monitoring period of 15 minutes (900 second), then the accumulated frequency channel in the load profile data has an expected predetermined accumulated frequency value of 216,000 ((4)(60 Hz)(900 sec)=216,000). If the recorded accumulated frequency measurement deviates from the predetermined accumulated frequency value, then the processor 1004 in the external system 1000 calculates the duration of the power interruption based on the magnitude of the deviation. For example, if the frequency channel in the load profile that is generated in the electric meter 100 produces a value of 213,120, then the external system identifies that the electric meter 100 recorded one or more power interruptions with a total duration ID of 12 seconds $$ID = \left(900 \text{ sec} - \left(\frac{213120}{216000}\right)(900 \text{ sec}) = 12 \text{ sec}\right).$$

Once again, the total duration of power interruptions ID is based on a ratio of the accumulated frequency measurement divided by the predetermined accumulated frequency value, as well as the length of the predetermined monitoring period. In some configurations, the processor 1004 in the external monitoring system 1000 only calculates the duration of a power interruption if the electric meter 100 sets the partial monitoring period flag in the load profile, which indicates that the electric meter 100 detected at least one power loss event during a predetermined monitoring period. In this configuration, the external monitoring system ignores small deviations in the accumulated frequency count that might occur during normal operation of the electric meter 100.

In another configuration, the external monitoring system 1000 identifies the duration of a power interruption that occurs during at least one of the predetermined monitoring periods based on the accumulated zero crossing count in the load profile data that are received from the electric meter 100. As described above, the zero crossing channel includes a data parameter for the accumulated number of zero crossing events that the meter 100 detects during the predetermined monitoring period. The processor 1004 in the external monitoring system 1000 identifies the total duration of one or more power interruptions that occur during a monitoring period based on a deviation between the total number of recorded zero crossing events in the load profile from a predetermined nominal number of expected zero crossing events that are expected to occur during the predetermined monitoring period. For example, given a 60 Hz frequency AC power signal and a monitoring period with a duration of 900 seconds, the nominal value of the predetermined number of zero crossing events $Z_{nom}$ that is expected occur during the predetermined monitoring period is $Z_{nom}$=2(60 Hz)(900 sec)=10,800 zc where zc represents "zero crossings". If the processor 1004 measures $Z_{counted}$=10,656 during a predetermined monitoring period for the zero crossing channel, then the processor 1004 in the external monitoring system 1000 identifies that the measured accumulated value of zero crossings corresponds one or more power interruptions with a total duration ID of:

$$ID = 900 \text{ sec} - \left(\frac{10,656 \text{ zc}}{10,800 \text{ zc}}\right)(900 \text{ sec}) = 12 \text{ sec}.$$

Once again, the total duration of power interruptions ID is based on the ratio of the counted zero crossing events divided by the predetermined number of zero crossing events, as well as the length of the predetermined monitoring period. The duration of the power interruption increases as the number of measured zero crossing events in the zero crossing channel of the load profile experiences larger deviations from the predetermined nominal number of zero crossing events that are expected to occur during the predetermined monitoring period. In some configurations, the processor 1004 in the external monitoring system 1000 only calculates the duration of a power interruption if the electric meter 100 sets the partial monitoring period flag in the load profile, which indicates that the electric meter 100 detected at least one power loss event during a predetermined monitoring period. In this configuration, the external monitoring system ignores small deviations in the accumulated zero crossing count that might occur during normal operation of the electric meter 100.

In an alternative configuration, the control device 180 in the electric meter 100 identifies the total duration of power interruptions during each predetermined monitoring period based on either or both of the accumulated frequency count channel and the zero crossing channel in the load profile (block 212). In this embodiment, the control device 180 identifies the total duration of the power interruptions in the same manner that is described above for the external monitoring system 1000, and the control device 180 stores the total duration of power interruptions in the memory 192. In some embodiments, the control device 180 generates the load profile data including a separate channel that indicates the total duration of power interruptions that occur during each predetermined monitoring period and transmits the power interruption data to the external monitoring system 1000 as part of the load profile. Additionally, the control device 180 can store a sum of a total value for all power interruptions that occur over a series of monitoring periods, such as a sum of the total duration of power interruptions that occur during a predetermined monitoring period added to a sum stored in the memory 192 for one or more earlier monitoring periods. The external monitoring system 1000 can request the total duration of power interruptions from the electric meter 100 as part of the process for calculating SAIDI or other power interruption monitoring calculations that cover longer periods of time such as hours, days, months, weeks, years, etc., and the control device 180 optionally resets the sum of the total duration of power interruptions after reporting the data to the external monitoring system 1000. In some configurations, both the external monitoring system 1000 and the electric meter 100 identify the total duration of power interruptions as described above.

Figure 3:
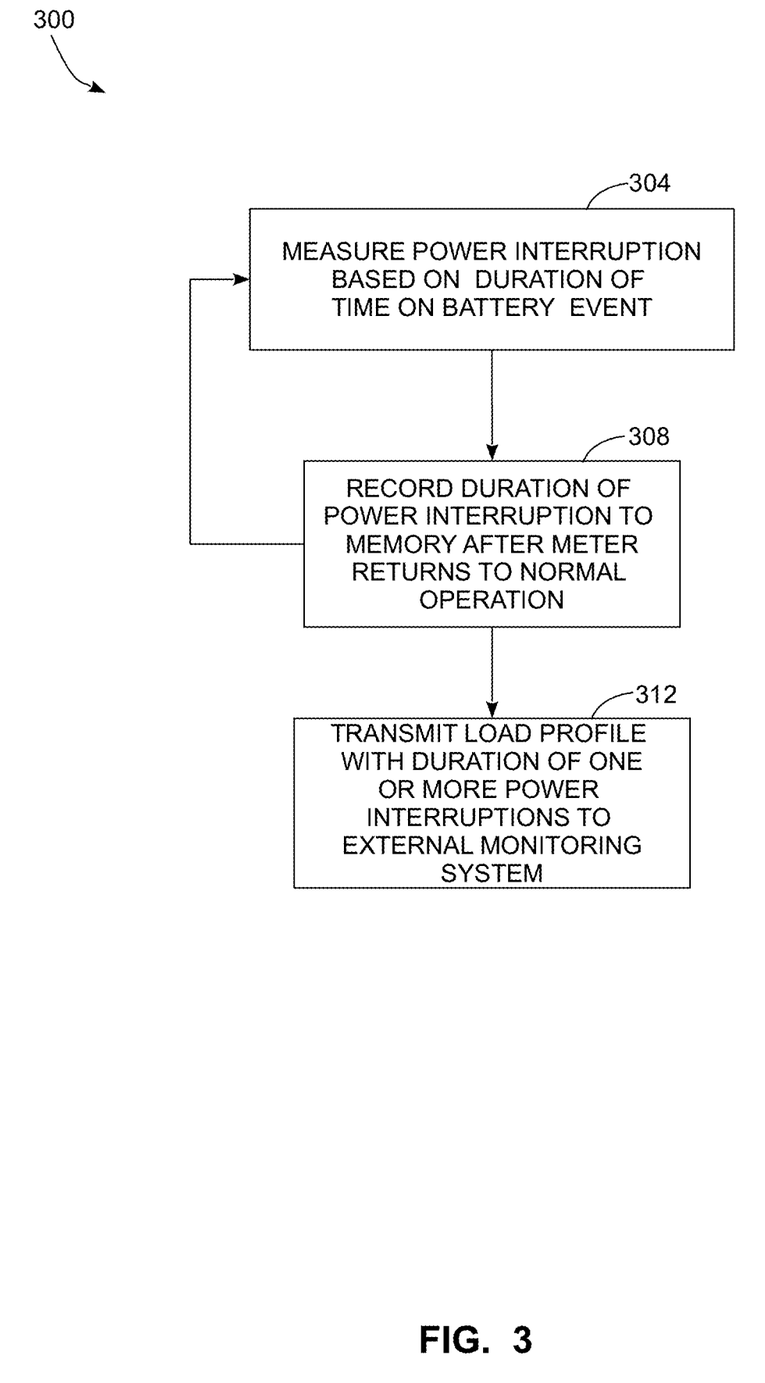
FIG. 3 is a block diagram of another process that the electric meter 100 performs to measure the duration of power interruptions.

FIG. 3 depicts a process 300 for operation of an electric meter to measure, record, and report the durations of power interruptions. In the description below, a reference to the process 300 performing a function or action refers to the operation of a control device to execute stored program instructions to perform the function or action in association with other components in an electric meter. The process 300 is described in more detail below in conjunction with the electric meter 100 of FIG. 1.

During the process 300, the processor 1004 in the external monitoring system 1000 or the control device 180 in the electric meter 100 measures the duration of a power interruption based on a duration of a "time on battery" event (block 304). The term "time on battery" refers to a time period of operation in the electric meter 100 in which the power supply 196 uses the battery 198 to provide electrical power to components in the electric meter 100. The time on battery occurs when the power supply 196 receives no electrical power or an insufficient level of electrical power for normal operation from the external power line during a power interruption. While FIG. 1 depicts the battery 198 as being integrated with the power supply 196 for illustrative purposes, in some embodiments the battery 198 is incorporated into the metrology circuit 150, including in embodiments where the battery 198 only supplies electrical power to the RTC 190 during power interruptions.

In one configuration, the battery 198 in the power supply 196 provides electrical power to maintain operation of at least the control device 180 in the electric meter 100 and the power supply 196 sends a first signal to the control device 180 to indicate that the electric meter 100 is operating on battery power at the start of the power interruption. After external electrical power is restored, the power supply 196 sends a second signal to the control device 180 to indicate that the electric meter 100 is again receiving external electricity from the power line and is not operating from electrical power supplied by the battery 198 at the end of the power interruption. The control device 180 identifies the "time on battery" and the duration of the power interruption based on the difference in time between receiving the first on-battery signal from the power supply 196 and the second off-battery signal from the power supply 196.

In another configuration, the battery 198 in the power supply 196 does not provide power for full operation of the control device 180, which shuts down during a power interruption. Instead, the battery 198 supplies enough power to maintain operation of the RTC 190 while the other components in the electric meter 100 are not operational. In many practical embodiments the battery 198 can supply power to operate the RTC 190 for prolonged power interruptions that may last for hours, days, or weeks. After the end of the power interruption, the control device 180 returns to operation and identifies the time on battery as the time difference between a timestamp associated with a shutdown event that is stored in an event log in a non-volatile portion of the memory 192 at the beginning of the power interruption and the present time of the RTC 190 that the control device 180 reads at the end of the power interruption. The control device 180 identifies the duration of the power interruption based on the time on battery even though the control device 180 was not fully operational during the power interruption.

The process 300 continues as the control device 180 records the duration of the power interruption to the memory 192 after the electric meter 100 returns to normal operation (block 308). In one configuration the control device 180 stores the duration of each power interruption in the memory 192 in association with a timestamp identifying the start or end of the power interruption. In another configuration, the control device 180 stores a single record of a total duration of one or more power interruptions in the memory 192 and adds the duration of the most recent power interruption to a value stored in the memory 192 that corresponds to a total sum of durations for previously recorded power interruptions.

The process 300 continues as described above with reference to the processing of blocks 304-308 until the electric meter 100 transmits the load profile data including a channel that indicates the total duration of one or more recorded power interruptions to the external monitoring system 1000 based on the measured time on battery (block 312). In one configuration, the control device 180 uses the network communication device 184 to transmit the power interruption duration data stored in the memory 192 to the external monitoring system 1000 via a data network. In another configuration, the control device 180 operates the in-meter interface 188 to report the power interruption duration data via a display screen or a peripheral connection to a computerized meter reader device. In some embodiments, the electric meter 100 transmits the power interruption duration data as part of the load profile at regular intervals (e.g. after each monitoring period, hourly, daily, weekly, monthly, annually), while in other embodiments the electric meter 100 transmits the power interruption duration data in response to a request from the external monitoring system 1000 or meter reader. After reporting the total duration of the power interruptions, the electric meter 100 can reset internal power interruption counters in the memory 192, if any, and continue the operations of the process 200 as described above to record the durations of additional power interruptions during operation of the electric meter 100.

The embodiments described herein improve the accuracy of monitoring the duration of power interruption events in large power systems because individual electric meters, such as the meter 100, can monitor the duration of even short power interruptions with a high level of accuracy and report the total duration of the power interruptions to a centralized monitoring system. The centralized monitoring system uses the power interruption data from multiple electric meters to monitor the reliability of a power grid and to identify SAIDI for a power grid with greater accuracy than in prior art systems.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A method of identifying power interruptions comprising:
    receiving, with an external monitoring system, a load profile transmitted from an electric meter computing device that includes:
        (1) at least one of an accumulated frequency measurement based on frequency measurements made by the electric meter computing device, and an accumulated number of zero crossing events based on zero crossing events counted by the electric meter computing device, in an alternating current (AC) power signal during one or more predetermined monitoring periods; and
        (2) for one or more of the one or more predetermined monitoring periods, a monitoring period flag set by the electric meter computing device that indicates that the electric meter computing device detected at least one power loss event during the respective predetermined monitoring period; and
    identifying, with a processor in the external monitoring system and for each monitoring period flag detected in the load profile, a total duration of at least one power interruption during a particular predetermined monitoring period associated with the detected monitoring period flag based on at least one of:
        (A) a deviation of the accumulated frequency measurement in the load profile from a predetermined accumulated frequency value, or
        (B) a deviation of the accumulated number of zero crossing events in the load profile from a predetermined number of zero crossing events during the predetermined monitoring period.

2. The method of claim 1 further comprising: identifying, with the processor in the external monitoring system, the total duration of the at least one power interruption based on a ratio of the accumulated frequency measurement divided by a predetermined accumulated frequency value that is expected for the AC power signal during the particular predetermined monitoring period.

3. The method of claim 1, further comprising: identifying, with the processor in the external monitoring system, the total duration of the at least one power interruption based on a ratio of the accumulated number of zero crossing events divided by a predetermined number of zero crossing events that is expected for the AC power signal during the particular predetermined monitoring period.

4. The method of claim 1, further comprising:
    identifying, with a control device in the electric meter, at least one of:
        the accumulated frequency measurement of the AC power signal in a power line that is connected to the electric meter during the particular predetermined monitoring period; or
        the accumulated number of zero crossing events in the AC power signal during the particular predetermined monitoring period; and
    transmitting, with an output device in the electric meter, the load profile that includes at least one of the accumulated frequency measurement and the accumulated number of zero crossing events to the external monitoring system to enable the external monitoring system to identify the total duration of the at least one power interruption in the AC power signal that occurs during the particular predetermined monitoring period.

5. The method of claim 4, further comprising: identifying, with the control device in the electric meter, the total duration of the at least one power interruption based on at least one of a deviation of the accumulated frequency measurement in the load profile from a predetermined accumulated frequency value or a deviation of the accumulated number of zero crossing events in the load profile from a predetermined number of zero crossing events during the particular predetermined monitoring period.

6. The method of claim 5, further comprising: identifying, with the control device in the electric meter, the total duration of the at least one power interruption based on a ratio of the accumulated frequency measurement divided by a predetermined accumulated frequency value that is expected for the AC power signal during the particular predetermined monitoring period.

7. The method of claim 5, further comprising: identifying, with the control device in the electric meter, the total duration of the at least one power interruption based on a ratio of the accumulated number of zero crossing events divided by a predetermined number of zero crossing events that is expected for the AC power signal during the particular predetermined monitoring period.

8. The method of claim 5, further comprising: transmitting, with an output device in the electric meter, the load profile including the total duration of the at least one power interruption identified by the control device in the electric meter to the external monitoring system to enable the external monitoring system to identify the total duration of the at least one power interruption.

9. The method of claim 1, wherein the each of the predetermined monitoring periods is a fifteen (15) minute time period.

10. A system for monitoring power interruptions comprising:
    an electric meter comprising:
        a voltage sensor;
        an output device; and
        a control device operatively connected to the voltage sensor and the output device, the control device being configured to:

monitor an alternating current (AC) power signal in a power line that is connected to the electric meter using the voltage sensor;

identify at least one of an accumulated frequency measurement of the AC power signal during a predetermined monitoring period or an accumulated number of zero crossing events in the AC power signal during the predetermined monitoring period; and transmit a load profile that includes:
- a monitoring period flag that indicates that the electric meter computing device detected at least one power loss event during the predetermined monitoring period; and
- at least one of the accumulated frequency measurement and the accumulated number of zero crossing events with the output device to an external monitoring system to enable the external monitoring system, in response to detecting the monitoring period flag, to identify a total duration of at least one power interruption in the AC power signal that occurs during the predetermined monitoring period.

11. The system of claim 10, the external monitoring system further comprising: a processor configured to identify the total duration of the at least one power interruption based on at least one of:
- a deviation of the accumulated frequency measurement in the load profile from a predetermined accumulated frequency value; or
- a deviation of the accumulated number of zero crossing events in the load profile from a predetermined number of zero crossing events during the predetermined monitoring period.

12. The system of claim 11, the processor in the external monitoring system being further configured to: identify the total duration of the at least one power interruption based on a ratio of the accumulated frequency measurement divided by a predetermined accumulated frequency value that is expected for the AC power signal during the predetermined monitoring period.

13. The system of claim 11, the processor in the external monitoring system being further configured to: identify the total duration of the at least one power interruption based on a ratio of the accumulated number of zero crossing events divided by a predetermined number of zero crossing events that is expected for the AC power signal during the predetermined monitoring period.

14. The system of claim 10, the control device in the electric meter being further configured to: identify the total duration of the at least one power interruption based on at least one of:
- a deviation of the accumulated frequency measurement in the load profile from a predetermined accumulated frequency value; or
- a deviation of the accumulated number of zero crossing events in the load profile from a predetermined number of zero crossing events during the predetermined monitoring period.

15. The system of claim 14, the control device in the electric meter being further configured to: identify the total duration of the at least one power interruption based on a ratio of the accumulated frequency measurement divided by a predetermined accumulated frequency value that is expected for the AC power signal during the predetermined monitoring period.

16. The system of claim 14, the control device in the electric meter being further configured to: identify the total duration of the at least one power interruption based on a ratio of the accumulated number of zero crossing events divided by a predetermined number of zero crossing events that is expected for the AC power signal during the predetermined monitoring period.

* * * * *